United States Patent [19]

Ryding

[11] 4,229,655
[45] Oct. 21, 1980

[54] VACUUM CHAMBER FOR TREATING WORKPIECES WITH BEAMS

[75] Inventor: Geoffrey Ryding, Manchester, Mass.

[73] Assignee: Nova Associates, Inc., Beverly, Mass.

[21] Appl. No.: 41,888

[22] Filed: May 23, 1979

[51] Int. Cl.$^2$ .................... A61K 27/02; B01K 1/08
[52] U.S. Cl. ............................ 250/400; 250/492 B
[58] Field of Search ............... 250/400, 492 R, 492 A, 250/457, 492 B

[56] References Cited

PUBLICATIONS

"High Speed Rotating Vacuum Seal" by Booth & Logan UCRL 78792 Oct., 1976.
"Vacuum Sealing Techniques" by Roth, pp. 538-540.

*Primary Examiner*—Harold A. Dixon

[57] ABSTRACT

Apparatus for directing a beam at a workpiece in vacuum has a special planar sliding multiple seal arrangement that enables repeated scanning movement of the workpiece across the beam. The seal includes a planar slide plate and an opposed relatively movable seal support member, also preferrably a plate parallel to the slide plate. Aligned apertures are in the members, one of which is larger in the direction of relative movement than the other enabling the relative movement while maintaining the alignment. A plurality of concentric resilient seals, which may be of oval race track configuration, bear with a sliding contact against the planar surface, these seals preferably comprising composites of a thin high density polyethylene seal element and a soft and only milding compressed backing element that applies a feather-light seal pressure. Between-seal pumping is provided to reduce the differential pressure across any seal to to remove gas that may leak into the space. The embodiment shown incorporates the seal between a moving target chamber and a fixed ion beam chamber.

24 Claims, 4 Drawing Figures

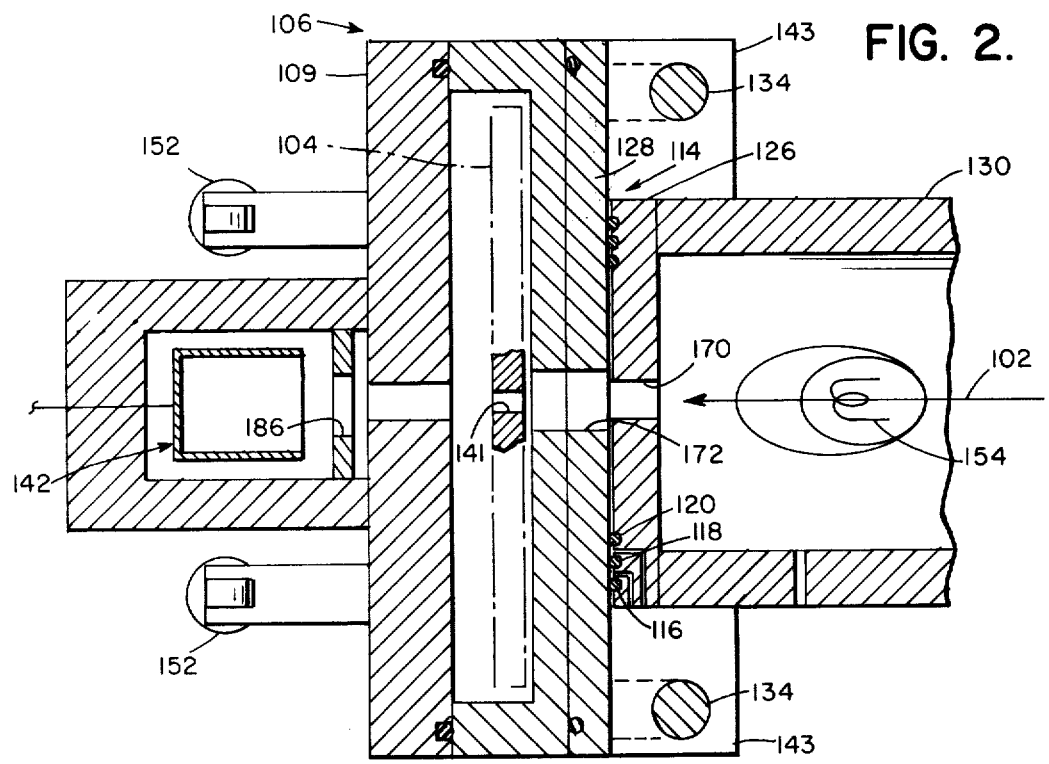
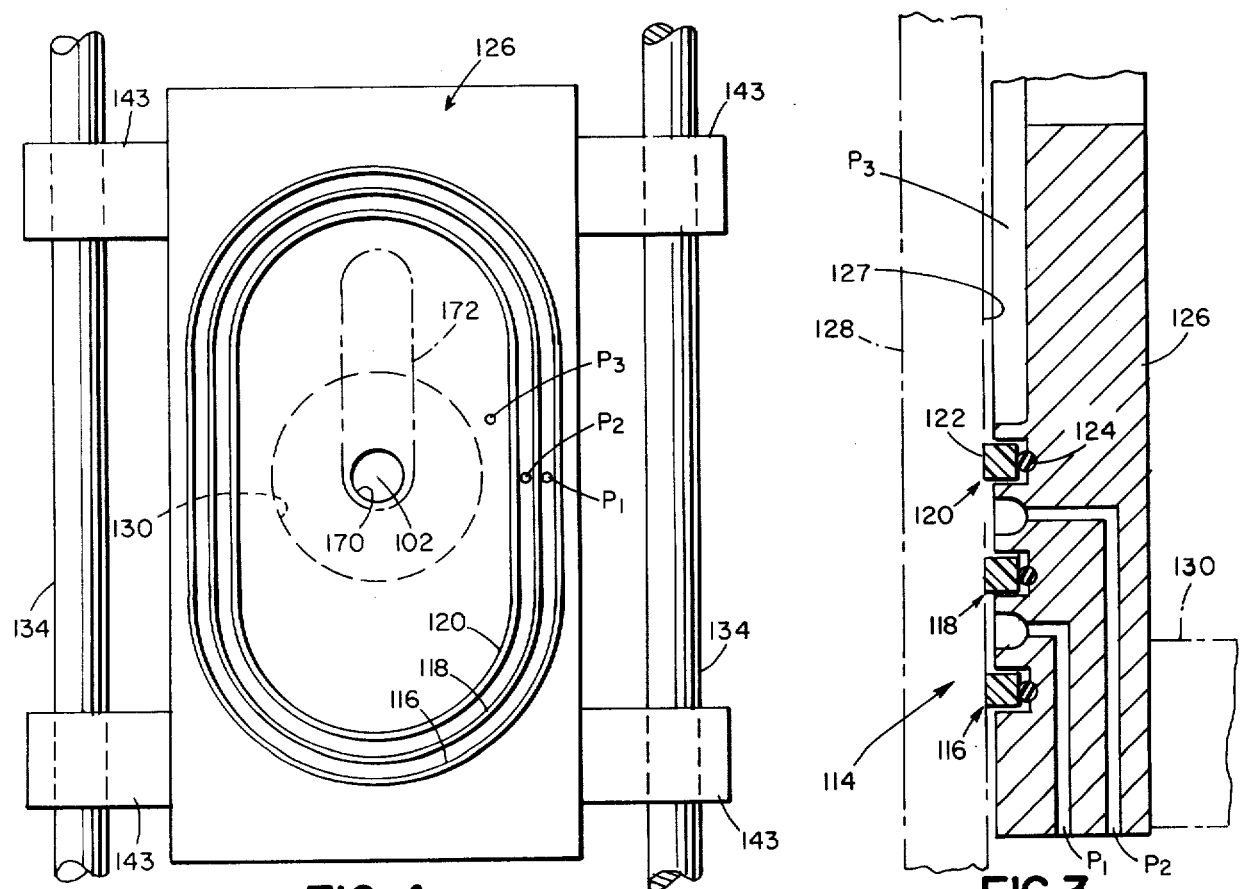

VACUUM CHAMBER FOR TREATING WORKPIECES WITH BEAMS

FIELD OF THE INVENTION

This invention relates to apparatus for providing relative movement in vacuum chambers for treating workpieces with beams, particularly for implanting ions in semiconductor wafers.

BACKGROUND OF THE INVENTION

In ion implantation of semiconductor wafers and other processes in which a beam of particles or radiation is directed at a workpiece through a vacuum, it is necessary to support the workpieces in an array on a support element (e.g., a spinning disk), and the support element is moved with respect to the beam, usually in two directions.

The vacuum chamber must either house the drive equipment or the drive equipment must be introduced from the outside. Housing the drive equipment in the vacuum chamber presents problems of contamination of the vacuum environment with grease, etc., and makes the chamber large and costly to pump down after opening. Driving the equipment from outside has caused mechanical complexity and expense and has made it difficult to introduce cooling water and the like to the wafer support members.

Some conventional beam-treatment devices employ planar vacuum seals consisting of two very smooth (optically flat) planar surfaces that move relative to one another without making contact. The smooth plates required are extremely expensive, particularly when large enough to accomodate several inches of relative movement. This cost makes them unattractive for many applications. To maintain a vacuum with such devices, the gap between the two smooth surfaces is pumped from a plurality of positions.

In other evacuated beam devices, such as electron microscope sample stages, sample position is adjusted a small distance (e.g., one inch) by sliding a single annular seal against a planar surface. To maintain a vacuum, the seal is very tightly compressed against the surface. The seal compression force results in very large frictional resistance to movement, but because beam position adjustments are made slowly and infrequently the friction is of little consequence.

SUMMARY OF THE INVENTION

I have found an inexpensive and effective means for slideably sealing two parts of an evacuated beam treatment apparatus so as to markedly reduce the complexity and make water-cooling simple. When used to slideably-connect two chambers, one housing the wafer support and the other the beam, the evacuated volume is reduced thus reducing the time required to reestablish a vacuum after a workpiece substitution, and increasing workpiece throughput.

Broadly, the invention concerns an apparatus for directing a beam at a workpiece, this apparatus including a support member for carrying the workpiece and an evacuated region surrounding the support member and the path of the beam, the source of the beam and the support member for the workpiece being relatively movable in a direction transverse to the beam, there being a sealing means accomodating the relative motion while maintaining the evacuated condition. According to the invention the sealing means comprises a slide member defining a planar sliding surface extending in the direction of relative motion, seal support member generally parallel to and spaced from the surface by a gap, aligned apertures in the members, one of which is larger in the direction of relative motion than the other, enabling the relative motion while maintaining the alignment, and a plurality of resilient seals bearing with sliding sealing contact against the planar surfaces. These seals each span the gap and extend in successive loops fully around the first and second apertures in all relative positions of the apertures, these loops being such that outer loops wholly surround inner loops, and a between-seal pumping means is provided for pumping the region radially intermediate two of the seals.

In the preferred embodiment, one vacuum chamber encloses the support element and workpieces (and is preferably just large enough to contain the support element and workpieces), and the other chamber provides a passage for the beam (and is preferably no larger than required for beam passage). The two chambers are sealed by the plurality of resilient seals each supported in a seal support member fastened to one chamber. A vacuum pump is connected to the region between seals to thereby lower the drop in pressure that must be achieved across any one seal. The seals span the gap between the seal support member and a planar slide surface fastened to the other chamber. Beam-passage apertures are provided in both the seal support member and the planar slide surface, with the apertures sized to overlap at the beam location for any relative position of the two chambers. The resilient seals then extend in generally concentric loops around the apertures in any of their relative positions.

By providing a plurality of resilient seals and between-seal pumping, each seal need not be compressed much in the direction normal to the slide plate. This lower compression reduces friction, thereby reducing seal wear and power requirements for the drive mechanism, and makes such a planar, sliding seal practical for a continuously operating machine such as a vacuum scanner.

In preferred embodiments, an array of workpieces are supported on the support element; relative movement exceeds 6 inches; the beam and chamber enclosing it are stationary; the workpiece support moves in a straight path to traverse the workpiece across the beam; apparatus is provided to move the workpiece in a second direction (e.g., rotating) orthogonal to the straight path, to enable treatment over an extended area of the workpiece; the support element supports workpieces at a substantial angle (e.g., 90°) to the beam; a plurality of generally concentric resilient seals extend in an oval racetrack configuration, each seal bearing against the planar slide surface; each resilient seal includes a low-friction member in contact with the planar slide surface and a more-resilient member bearing against the low-friction member and urging it toward the planar surface; the two members are supported in a recess in a second planar surface parallel to the first surface; and ports are provided between the plurality of seals for establishing a series of different pressure levels, thereby allowing each seal to be under relatively low compression and thus provide lower overall friction resistance.

The seal is preferrably of composite construction including a wear resistant seal element (e.g. high density polyethylene) engaged by a soft resilient ring (e.g. durometer of the order of 40) which is compressed no more than about 10%. The thinness (e.g. ⅛" in the direction normal to the planar slide surface) of the wear resistant element enables it to conform in good sealing relation to a slide surface made with a normal manufacturing tolerance.

PREFERRED EMBODIMENT

The structure and operation of a preferred embodiment of the invention will now be described, after first briefly describing the drawings.

BRIEF DESCRIPTION OF THE DRAWINGS

FIG. 2 is a cross-sectional view at 2—2 of FIG. 1.

FIG. 3 is an enlargement of a portion of FIG. 2, showing vacuum seals.

FIG. 4 is a cross-sectional view at 4—4 of FIG. 1, showing the seal plate.

DETAILED DESCRIPTION

Figure 1:
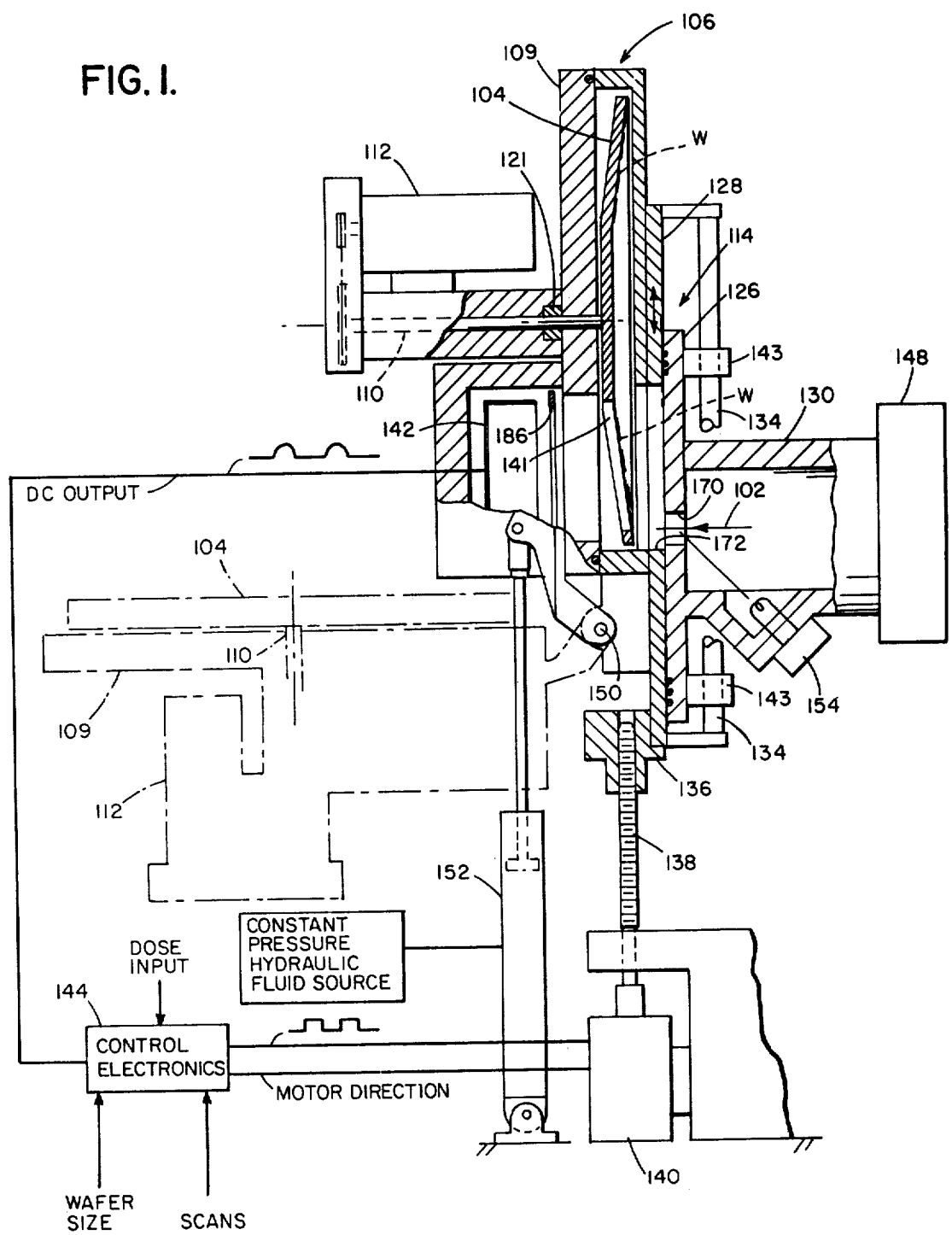
FIG. 1 is somewhat diagrammatic, cross-sectional view of the preferred embodiment in which wafers are supported on a rotating disk.

Referring to the figures, wafers W are mounted on the surface of a spinning disk 104, which rotates at approximately 800 rpm. The disk is contained in vacuum chamber 106, (FIG. 1), and is approximately 25 inches in diameter and ¾ inch thick. Chamber 106 is only slightly larger than the disk so as to minimize evacuated volume, the chamber being approximately 25 ½ inches in diameter and 1 and ½ inches thick. Eighteen three-inch-diameter wafers W are mounted on the disk in a single annular layer. Alternatively, thirteen 4" wafers could replace the eighteen smaller ones. The disk is supported on a spindle 110, which passes through the wall of the vacuum chamber 106. In order to effect a high vacuum seal around this spindle, well-know ferrofluidic seals 121 are used. The disk is driven by a DC servo-system 112, with the velocity of rotation held constant to better than 0.5%. The second axis of motion enables the entire disk chamber 106 to be moved laterally so as to move the stationary beam radially with respect to the disk. A sliding high-vacuum seal 114 permits this lateral motion. The seal consists of fixed concentric sealing rings 116, 118, 120 in fixed plate 126 bearing against moving slide plate 128. The seals have a high-wear-resistance ring 122 (high-density and high-molecular weight polyethylene) backed by an O-ring 124 of soft-durometer buna, which provides the necessary sealing forces. Three successive seals are provided so that the individual seals do not need to undergo full atmospheric to high-vacuum differential pressure.

O-ring 124 has a durometer value of 40, which is softer than conventional O-rings, which generally are of 60 durometer. The cross-sectional diameter of the O-ring is 0.275 inches uncompressed. The installed compression is from about 0.005 to 0.010 inches, which is considerably less than the compression conventionally used in an O-ring seal, i.e., 20 to 30 percent, or about 0.070 inches for this size O-ring. The softer O-ring and smaller compression add up to a very low compression force on the polyethylene sealing ring 122. Slide plate 128 has a flatness and parallelism tolerance of 0.005 inches or less. This amount of variation can be accommodated by the resilience of the O-ring without significant leakage occurring, although a small amount of leakage can be accepted because of the between-seal pumping arrangement. Sealing rings 122 are designed to have sufficient flexibility to conform to the variations in plate 128. The rings are about ¼ inch wide and ⅛ inch thick. The grooves containing rings 122 and O-rings 124 are about 0.010 inch wider than rings 122 to assure that rings 122 have freedom of movement to bend in conforming to undulations in the surface of the slide plate. Slide plate 128 has about a 16 microinch finish.

By use of the concentric planar seals and between-seal pumping, adequate sealing across each seal can be achieved while also using relatively low compression forces on the seal, thereby reducing frictional resistance to lateral motion and improving wear and vacuum reliability. In order to further reduce friction, surface 127 of slide plate 128, against which the seals slide, is hardened and polished (hard anodized coat of aluminum infused with DuPont's Teflon (polyletrafluoroethylene) by the Nituff process of Nimet Industries). An alternative to the Nituff surface is a hard-chromed surface, as hardness is an important consideration. The Teflon in the Nituff surface is believed to fill the pores, and thereby provide a lubrication effect. The anodizing of the surface provides the desired hardness. The between-seal pumping is provided by conventional rotary vane, two-stage vacuum pumps which have oil lubrication. Pressure $P_1$ (FIG. 3) in the region between seals 116 and 118 is typically 1 torr. Pressure $P_2$ in the region between seal 118 and 120 is typically $5 \times 10^{-2}$ torr. Pressure $P_3$ in the chamber is typically $1 \times 10^{-6}$ torr.

Chamber 106 is supported by a linear bearing system and a linear drive system, which provide the desired lateral motion of the chamber and hold the chamber away from the slide plate. The linear bearing system includes two stationary Thompson linear bearings 143 through which slide circular shafts 134, attached to the moving chamber 106. The chamber is moved laterally by stepping motor 140, which drives lead screw 138, threaded in nut 136 attached to the chamber. Beam current striking disk 104 from which electrons are suppressed by electron deflection means 186 is measured by a Faraday cage 142 positioned on the back side of the disk. A slot 141 is provided in the disk at a suitable location between the wafers from near the outer edge of the disk to the innermost radial position at which the beam strikes the disc. As the disk spins, a sample of the beam passes through the disk once every revolution, and strikes the Faraday cage 142. The samples of beam current measured during each disk revolution are fed to control electrons 144, which control motor 140. The control system moves the spinning disk through the stationary beam at a speed proportional to the detected beam current and inversely proportional to the desired ion dosage.

Disk 104 is constructed of aluminum, to provide good thermal conductivity and relatively good inertness to contamination of the semiconductor wafers. Aluminum also has a reasonably good heat capacity and it provides adequate rigidity for the high-speed rotating disk.

Cooling water inlet and outlet passages are provided within rotating shaft 110, and serve to remove heat from the hub of disk 104. Water passages can also be provided within the body of disk 104.

Heat transfer from the wafer to the disk must not be impeded in order for the thermal energy created by the ion beam to be transferred to the disk thereby keeping the total temperature rise of the wafers during implantation less than about 100° C. Beam 102 is generated by a source (not shown) and passes through vacuum gate valve 148, cylinder 130, circular hole 170 in plate 126, slot 172 in slide plate 128, and into chamber 106. Electron source 154 provides a shower of electrons to neutralize the charge of the ions being deposited on the wafers.

OPERATION

In operation of the preferred embodiment, the disk chamber is opened to exchange wafers by closing a vacuum gate valve 148 to seal off the evacuated ion beam generator, venting the chamber to atmospheric pressure, and opening the chamber.

In the embodiment of FIG. 1, the chamber cover 109, to which the disk 104, spindle 110, and drive motor 112 are attached, is rotatably supported on hinges 150. The cover is rotated 90° by cylinders 152 to the position shown in phantom lines, and a new disk with new wafers is substituted for the existing one. The cover is then restored to its normal closed position, the chamber is evacuated, and gate valve 148 is opened to connect the high-vacuum pumping system of the beam generator (not shown). At this time the rotary motion of the disk is initiated and the DC servo-system is used to bring the rotary velocity of the disk up to the fixed and constant operating velocity required for implantation. The operator selects the desired ion dosage, the wafer size, and the required number of scans, and gives a start signal to the electronics to initiate lateral motion of the chamber and disk. Once the implant is started, the entire disk chamber is moved laterally, with the disk moving through the beam the prescribed number of scans and at a velocity consistent with the measured beam intensity and the required dosage. During this scanning motion the cylinders 152 previously used to close the cover 109, now are furnished with hydraulic fluid by a constant pressure source and serve the purpose of bearing the weight of the disk-chamber assembly throughout its range of vertical travel.

Typically the scanning process may take anywhere from 1 to 60 minutes. On completion of the traversal of the disk and after it is determined that the disk has returned to initiation position with the beam located at the outer edge of the disk, the implantation is complete, and the sequence for closing the gate valve 148, venting the chamber 106, and reloading the disk spindle is initiated again.

All components have been designed to give a dosage accuracy of better than 1%. The lateral velocity has been limited so that it does not exceed maximum velocity of 1.0 inch per second. This means that the lateral distance between two successive passes of the beam will not exceed approximately 2 mm. As the beam 102 is typically on the order of 2 cm in diameter, this constraint on lateral velocity ensures excellent overlapping characteristics of the beam during the implantation process. In the described embodiment, the disk has a single sampling slot, and, as the disk is rotating at approximately 800 rpm, the period between successive beam samples is about 75 m sec. This sampling rate is sufficient to achieve an overall dosage accuracy and uniformity of better than 1%.

OTHER EMBODIMENTS

Other embodiments of the invention are within the scope of the following claims. For example, with a suitably large wafer chamber, only the disk shaft and parts supported by it may be translated, and the sliding seal can be arranged at the shaft behind the disk to accommodate this motion. Here again water cooling passages through the shaft can provide cooling to the disk.

What is claimed is:

1. Apparatus for directing a beam at a workpiece, said apparatus including a support member for carrying said workpiece and an evacuated region surrounding said support member and the path of said beam, the source of said beam and the support member for said workpiece being relatively movable in a direction transverse to said beam, there being a sealing means accomodating said relative motion while maintaining the evacuated condition, said sealing means comprising a slide member defining a planar sliding surface extending in said direction of relative motion, a seal support member generally parallel to and spaced from said surface by a gap, aligned apertures in said members, one of which is larger in the direction of relative motion than the other enabling said relative motion while maintaining said alignment, a plurality of resilient seals bearing with sliding sealing contact against said planar surfaces, said seals each spanning said gap and extending throughout with said contact in successive loops fully around said first and second apertures in all relative positions of said apertures, said loops being such that outer loops wholly surround inner loops, and between-seal pumping means for pumping the region radially intermediate two of said seals.

2. In apparatus for directing a beam at a workpiece, said apparatus including a support member for carrying said workpiece and an evacuated region surrounding said support member and the path of said beam, the improvement comprising a first vacuum chamber containing said support member, a second vacuum chamber communicating with said first chamber, said beam travelling through said second chamber and into said first to reach said support member, means for moving said first chamber relative to said second chamber in a direction generally transverse to said beam, sealing means for sealing said first chamber to said second chamber, said sealing means comprising a planar sliding surface extending in said direction of relative motion, a seal support member generally parallel to and spaced from said first surface by a gap, said planar surface and support members each including apertures for passing said beam, said apertures being sized to overlap at the location of said beam for any relative position of said first and second vacuum chambers, to thereby provide an uninterrupted path for said beam between said chambers, and a plurality of resilient seals bearing with sliding sealing contact against said planar surface, said seals each spanning said gap and extending throughout with said contact in successive loops fully around said first and second apertures in all relative positions of said first and second chambers, said loops being such that outer loops wholly surround inner loops, and between-seal pumping means for pumping the region radially intermediate two of said seals.

3. The apparatus of claim 1 or 2 wherein said support member includes a disk means for supporting a plurality of workpieces.

4. The apparatus of claim 1 or 2 wherein said support is mounted to move in a straight path to traverse the work across said beam, said beam being stationary.

5. The apparatus of claim 4 including means to move said support in a second direction effectively orthogonal to said first mentioned direction and transverse to said beam to enable treatment of an extended area by said beam.

6. The apparatus of claim 5 including means for repeatedly moving said support in said two directions in a manner to treat a uniformly extended area of a workpiece.

7. The apparatus of claim 6 wherein said support is a disk having its general plane of extent set at a substantial angle to said beam,
and means for rotating said disk to produce, at the point where said beam strikes said disk, effective movement in said second direction.

8. The apparatus of claim 7 wherein a shaft rotatably mounting said disk and adapted to translate with respect to said beam includes water cooling passages for said support member.

9. The apparatus of claim 1 or 2 wherein said resilient sealing means is of oval race track configuration.

10. The apparatus of claim 1 or 2 including a support means for said resilient sealing rings in the form of a second planar surface, parallel to said planar sliding surface and having recesses holding said sealing rings.

11. The apparatus of claim 1 or 2 wherein a said resilient seal comprises at least one ring-form gasket member.

12. The apparatus of claim 11 wherein said resilient seal is a composite formed of two ring form members, a first ring form member bearing directly against said planar surface with low friction and a second more resilient member bearing against said first ring member and resiliently urging it against said planar surface.

13. The apparatus of claim 12 wherein said ring is carried in a recess in a second planar surface extending parallel to said planar sliding surface.

14. The apparatus of claim 12 wherein there are a series of said composite seals generally concentrically arranged, each bearing with sliding sealing contact against said planar surface, the thickness of each of said composite sealing rings spanning said gap and each extending throughout with said contact in a loop fully around said first and second apertures in all relative positions.

15. The apparatus of claim 14 including staged evacuation means for establishing a series of different pressure levels across said series of seals from ambient to within said chamber.

16. The apparatus of claim 12 wherein said first ring form member comprises high density polyethylene.

17. The apparatus of claim 16 wherein said sliding surface comprises anodized aluminum impregnated with polytetrafluoroethylene.

18. The apparatus of claim 12 wherein said second more resilient member has a durometer of about 40.

19. The apparatus of claim 18 wherein during operation said resilient member is compressed no more than about 10%.

20. The apparatus of claim 19 wherein said resilient member is compressed no more than about 0.010 inch.

21. The apparatus of claim 12 wherein said first ring has a thickness of about ⅛ inch and a width of about ¼ inch.

22. The apparatus of claim 1 or 2 wherein the range of relative motion is of the order of 6 inches or greater.

23. The apparatus of claim 1 or 2 wherein a rotatable shaft is associated with the movable member.

24. The apparatus of claim 23 wherein water cooling passages are within said shaft and are connected to cool said support member.

* * * * *